US006951513B1

(12) United States Patent  
Greenslade et al.

(10) Patent No.: US 6,951,513 B1  
(45) Date of Patent: Oct. 4, 2005

(54) ENCLOSURE FOR THE STORAGE AND OPERATION OF ELECTRONIC COMPONENTS HAVING INCREASED AIRFLOW CHARACTERISTICS

(75) Inventors: Michael D. Greenslade, San Leandro, CA (US); A. Fred Hendrix, Salida, CA (US); Francisco Martinez-Ponce, Modesto, CA (US)

(73) Assignee: Foundry Networks, Inc., Alviso, CA (US)

( * ) Notice: Subject to any disclaimer, the term of this patent is extended or adjusted under 35 U.S.C. 154(b) by 131 days.

(21) Appl. No.: 10/429,200

(22) Filed: May 2, 2003

(51) Int. Cl.[7] .................................................. H05K 5/00
(52) U.S. Cl. ........................ 454/184; 361/695; 361/694
(58) Field of Search ............................... 454/184, 185, 454/195; 361/695, 696; 165/122, 80.2; 312/236

(56) References Cited

U.S. PATENT DOCUMENTS

| | | | |
|---|---|---|---|
| 5,544,012 A | * | 8/1996 | Koike ........................ 361/695 |
| 6,088,225 A | * | 7/2000 | Parry et al. ................. 361/704 |
| 6,309,296 B1 | * | 10/2001 | Schwenk et al. ........... 454/184 |
| 6,315,656 B1 | * | 11/2001 | Pawlowski ................. 454/184 |
| 6,650,536 B2 | * | 11/2003 | Lee et al. ................... 361/687 |
| 6,717,807 B2 | * | 4/2004 | Hikawa ...................... 361/690 |

* cited by examiner

Primary Examiner—Derek S. Boles  
(74) Attorney, Agent, or Firm—Thelen Reid & Priest LLP; David B. Ritchie

(57) ABSTRACT

An enclosure for operationally retaining a plurality of electronic modules has a housing comprising front, side, upper, lower, and rear walls, and housing enclosing an inner volume. The enclosure has an inner wall running between the side walls and attached to the lower wall. The inner wall is positioned between the front and back walls, and splits the inner volume into a first inner volume and a second inner volume. The inner wall extends from the bottom wall to a height less than that of the height of said top wall, and defines an opening between the first inner volume and the second inner volume. An exhaust vent is disposed through the rear wall of the housing. Openings exist in the housing into the first inner volume. This allows an airflow into the first inner chamber. An environmental flow mechanism, such as a fan, is coupled in proximity to the exhaust vent. The environmental flow mechanism is directionally oriented to create an airflow from the upper portion of the housing outwards through the exhaust vent. The interaction of the directionally drawn air from the top of the casing and the inner wall of blocking an air flow in a lateral direction produces a flow of air in a particular orientation. The flow of air originates from the openings of the housing, moves upwards and laterally to the environmental flow opening, and outwards through the vent.

50 Claims, 7 Drawing Sheets

ENCLOSURE FOR THE STORAGE AND OPERATION OF ELECTRONIC COMPONENTS HAVING INCREASED AIRFLOW CHARACTERISTICS

FIELD OF THE INVENTION

The present invention relates to an enclosure in which electronic circuitry operates. More specifically, the invention relates to an enclosure having enhanced airflow characteristics to aid in heat transfer for the circuitry held within.

BACKGROUND OF THE ART

In many typical computer systems, a so-called "rack" system is implemented. In such a rack system, an electronic bus is provided and cards containing electronic circuits are attached thereto. In this manner, the individual electronic cards may be swapped in and out as needed.

During operation of the electronic equipment, one problem that is encountered is heat buildup within the environment. The circuits used in electronic components radiate heat. This heat can be transferred to the immediate environment, but if the immediate environment heats up, far less heat transfer between the circuits and the environment is possible.

When operating in such an elevated temperature, such circuits are more prone to operational failure. In extreme cases, the circuit may fail completely and be rendered permanently inoperable.

Typically, to effectuate heat transfer from the electronic circuits, an airflow is created in the casing that houses the components. This airflow typically allows for greater heat transfer when more air is in contact with the heated circuit components. With this technique, heat is dissipated from the elements into the air, which is in turn heated. This heated air is then removed from the casing, allowing for cooler air to be drawn into the casing. In this manner the airflow allows for both an enhanced heat transfer between the circuits and interior environment, as well as maintaining an effective heat transfer between the interior and exterior environments is accomplished.

BRIEF DESCRIPTION

An enclosure for operationally retaining a plurality of electronic modules is envisioned. The enclosure is made of a housing having front, side, upper, lower, and rear walls, the housing enclosing an inner volume. The enclosure has an inner wall running between the side walls and attached to the lower wall. The inner wall is positioned between the front and back walls, and splits the inner volume into a first inner volume and a second inner volume. The inner wall extends from the bottom wall to a height less than that of the height of said top wall, and defines an opening between the first inner volume and the second inner volume. An exhaust vent is disposed through the rear wall of the housing. Openings exist in the housing into the first inner volume. This allows an airflow into the first inner chamber. An environmental flow mechanism, such as a fan, is coupled in proximity to the exhaust vent. The environmental flow mechanism is directionally oriented to create an airflow from the upper portion of the housing outwards through the exhaust vent. The interaction of the directionally drawn air from the top of the casing and the inner wall of blocking airflow in a lateral direction produces a flow of air in a particular orientation. The flow of air originates from the openings of the housing, moves upwards and laterally to the environmental flow opening and outwards through the vent.

BRIEF DESCRIPTION OF DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of an enclosure for the storage and operation of electronic components having increased airflow characteristics. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another. Moreover, it will be appreciated that such a development effort might be complex and time-consuming, but would nevertheless be a routine undertaking of engineering for those of ordinary skill in the art having the benefit of this disclosure. In accordance with the present invention, the components or structures may be implemented using various types of items.

Figure 1:
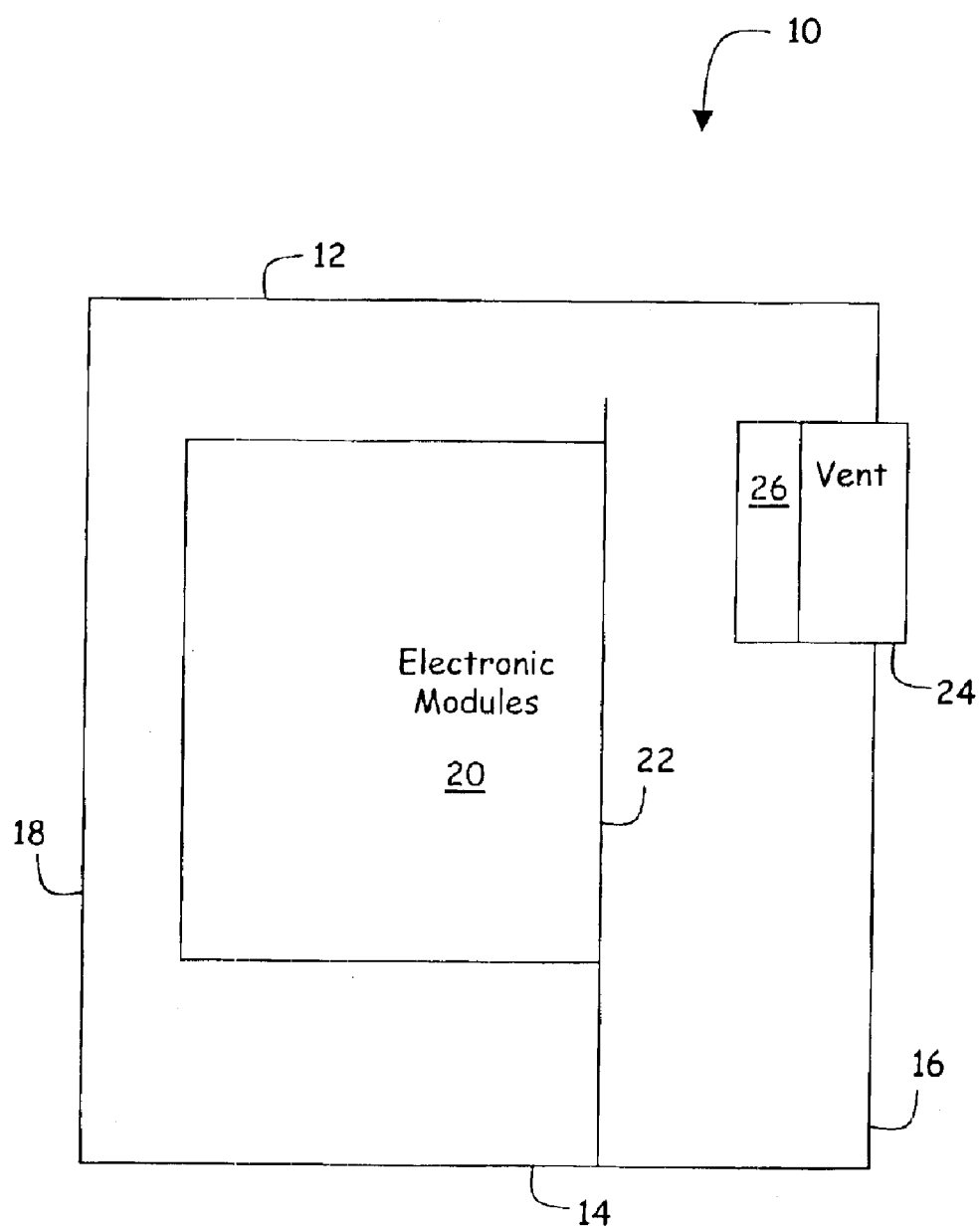
FIG. 1 is a cutaway side view of an enclosure as in accordance with the invention.

FIG. 1 is a cutaway side view of an enclosure as in accordance with the invention. An enclosure 10 allows for the operation of a plurality of electronic modules inside. The enclosure 10 is made up of housing comprising an upper wall 12 and a bottom wall 14. The upper wall 12 and the bottom wall 14 are both attached to a rear wall 16 and a front wall 18.

Also included, but not shown in FIG. 1, are two side walls. The two side walls are attached to the upper wall 12, the bottom wall 14, the front wall 18, and the rear wall 16. These top, bottom, front, back, and side walls form an enclosure that protects one or more electronic modules 20 that operate in the enclosure from any damage from an external environment.

The enclosure 10 also contains an inner wall 22. The inner wall 22 is attached to the two side walls (not shown) and to the lower wall 14. The inner wall 22 does not rise completely to the height of the upper wall 12. In this manner the inner wall 22 separates the enclosure 10 into a forward volume and a rear volume.

Since the inner wall 22 does not rise to the height of the upper wall 12, an environmental opening remains between the forward volume and the back volume of the enclosure 10. In this case, air can move between the forward and the rearward volumes of the enclosure 10 only through the environmental opening. Accordingly, the inner wall 22 transforms any lateral movement of air in the forward volume below the environmental opening into a vertical movement. As will be shown later in this disclosure, the environmental opening may be constructed in a number of different ways.

An exhaust vent is disposed through the rear wall 16. An environmental flow mechanism 26 is placed in proximity to the exhaust vent 24. Accordingly, when the environmental floor mechanism is engaged, a flow of air is created from inside the enclosure 10 to the outside environment.

Typically, an environmental flow mechanism may be a fan. However, other flow mechanisms are known to those skilled in the art, and this disclosure should be read as to include them as well. Such mechanisms may include such items as pumps, blowers, or any item operable to produce an environmental flow. Further, the vent and fan assemblies may be placed on any exterior wall, and the inclusion of them on the rear wall should be illustrative. Additionally, the number of fan and vent assemblies as shown in FIG. 1 is one. It should be noted that any numbers of these assemblies may be contemplated in the scope of this disclosure, as well as the placement of the assemblies on differing walls.

Working in concert with the environmental flow mechanism 26, openings are disposed through the walls of the enclosure 10. Typically, these will be present towards the front or bottom of the enclosure 10. Again, the openings may be disposed anywhere on the enclosure 10, and this description is not intended to limit the position of any such openings.

Accordingly, when the environmental flow mechanism 26 is engaged, air is vented out from the enclosure 10 through the vent 24 to the external environment. The resulting outflow creates a corresponding inflow from any openings disposed in the enclosure 10. In this manner, heated air is output from the enclosure 10 through the vent 24, and air internal to the enclosure 10 is drawn towards the vent from the its interior. This action, in turn, creates an inflow of air through the openings disposed in the enclosure 10 located away from the vent 26.

In particular, when an airflow is output through the vents 24 disposed on the rear wall 16, any airflow from the forward portion of the enclosure 10 must come through the environmental opening, defined at least in part by the inner wall 22. Accordingly, any airflow in the forward portion of the enclosure 10 is directed towards the environmental opening.

The placement of the environmental opening creates a twofold effect on the airflow within the enclosure 10. First, when the input openings are placed near the front of the enclosure 10, air must flow laterally across the electronic modules 20.

Second, the inner wall 22 acts to redirect any lateral flows in the forward volume of the enclosure 10 into vertical flows. Thus, any flow entering the enclosure 10 at a point lower than the environmental opening must flow upwards towards the environmental opening contained within the enclosure 10.

Accordingly, when the input openings are placed near the bottom of the forward portion of the enclosure 10, air must flow upwards across the electronic modules 20. In addition, the same airflow is also directed laterally across the electronic modules 20. Accordingly, the placement of the inner wall provides enhanced vertical and lateral flow of air across the height and width of the electronic modules 20 operating within the enclosure 10. In this manner, an improved heat transfer is accomplished for the electronic modules 20 with the use of the depicted enclosure 10.

In an exemplary embodiment, the inflow openings through the walls may be provided near the bottom portion of the inner volume of the enclosure 10. These inflow openings may be disposed in the side walls (not shown) or in the front wall 18. This allows for an enhanced vertical-oriented airflow.

In another exemplary embodiment, the inflow openings may be provided in the enclosure near the forward portion of the inner volume of the enclosure 10. These forward inflow openings may also be disposed in the side walls (not shown) or in the front wall 18. The more-forward placed openings provide for greater lateral airflow across the electronic modules.

Figure 2A:
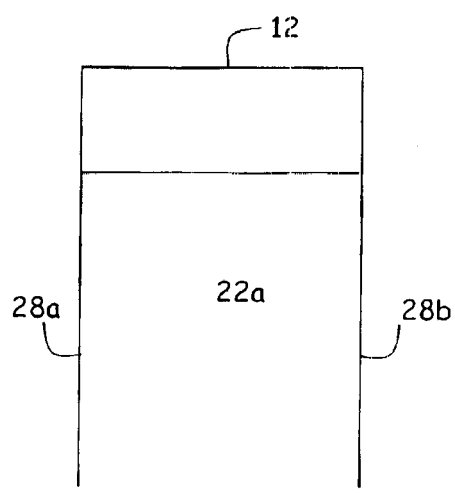
FIGS. 2A, 2B, and 2C are cut away views of the enclosure of FIG. 1, depicting the interaction between the inner, upper, and side walls of the enclosure of FIG. 1.
Figure 2B:
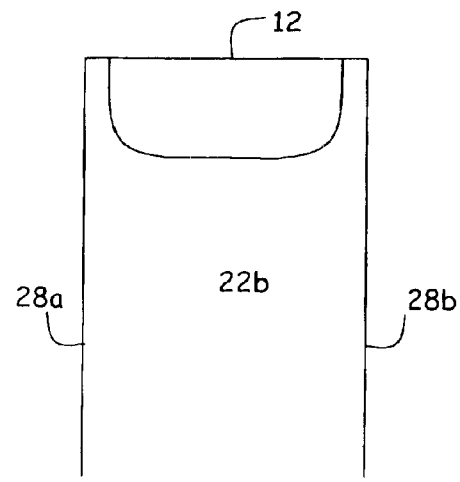

FIGS. 2A and 2B are cut away views of the enclosure of FIG. 1, depicting the interaction between the inner, upper, and side walls. In FIG. 2A an inner wall 22a is disposed between two side walls 28a and 28b. The inner wall 22a is attached to the side wall 28a and 28b. The inner wall 22a is not attached to the upper wall. In this embodiment, the side walls 28a and 28b, the upper wall 12, and the uppermost edge of the inner wall 22a define the environmental opening.

In another exemplary embodiment, depicted in FIG. 2B, the inner wall 22b is attached to the side walls 28a and 28b, much like that shown for FIG. 2A. However, in this case, the inner wall 22b is also partially attached to the upper wall 12. Note that the attachment to the upper wall 12 does not completely close the environmental opening.

Figure 2C:
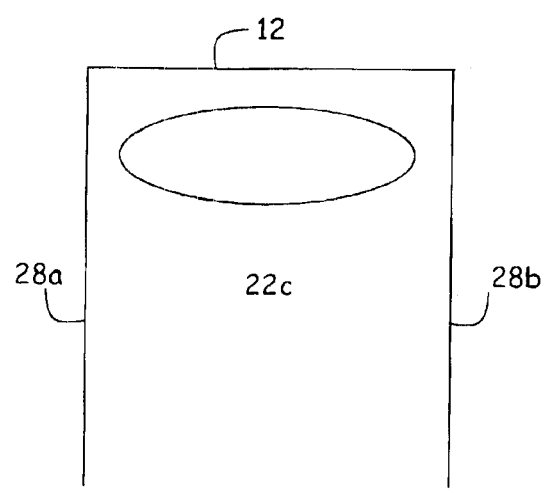

In yet another exemplary embodiment, depicted in FIG. 2C, the inner wall 22c is attached to the side walls 28a and 28b, much like that shown for FIG. 2A. However, in this case, the inner wall 22b is also attached to the upper wall 12. Note that the attachment to the upper wall 12 does not completely close the environmental opening, and that the inner wall defines the contours and location of the opening. Of course, many other constructions of the environmental opening may be envisioned by ones skilled in the art, and those constructions should be thought of as being included in this description. Accordingly, the inner wall 22 defines at least one edge of the environmental opening.

It should be noted that the vent 24 and the environmental flow mechanism 26 may be located at any points on the rear wall 16. However, in one embodiment of the invention, the position of the environmental flow mechanism 26 and the vent 24 on the rear wall 16 are designed such that the outflow of air is directionally oriented from the upper portion of the enclosure 10. However, as stated previously, the environmental flow mechanism 26 and the vent 24 may be placed at any point on the rear wall 16.

Figure 3:
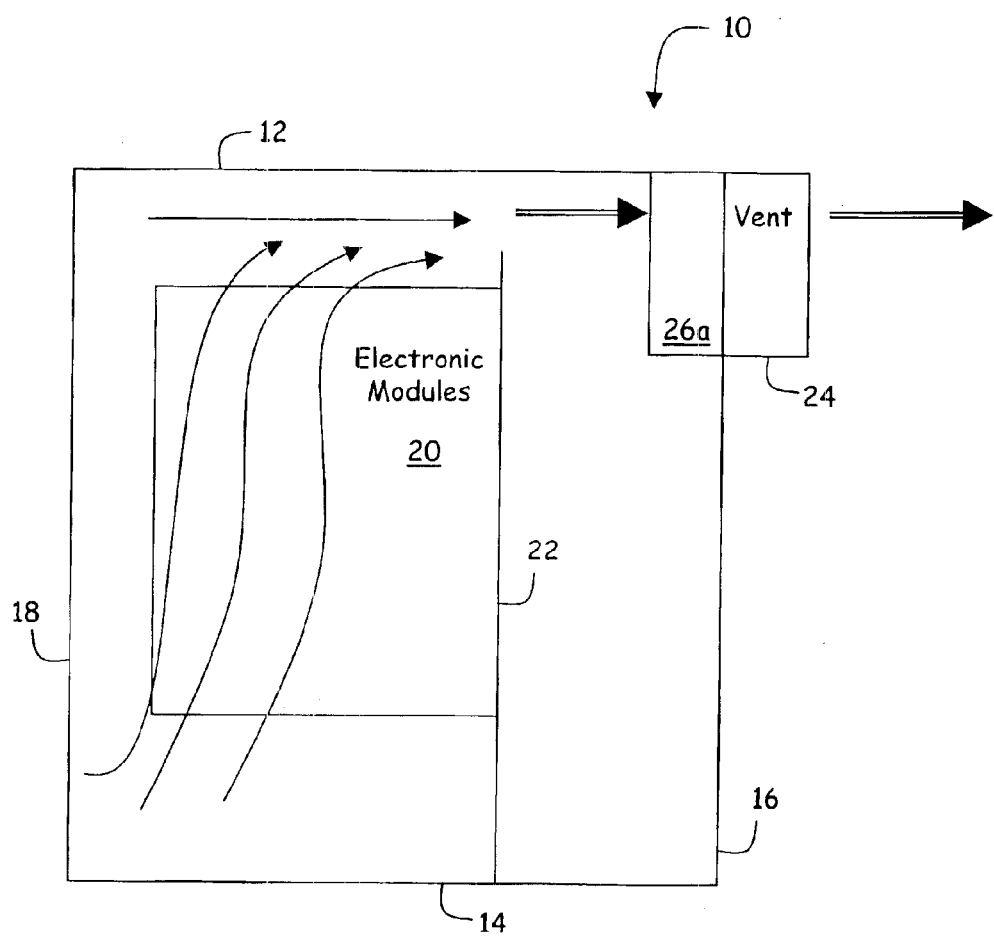
FIGS. 3 and 4 are detailed side view diagrams of the relationship of the environmental flow mechanism, the vent, and the environmental opening in accordance with the invention.
Figure 4:
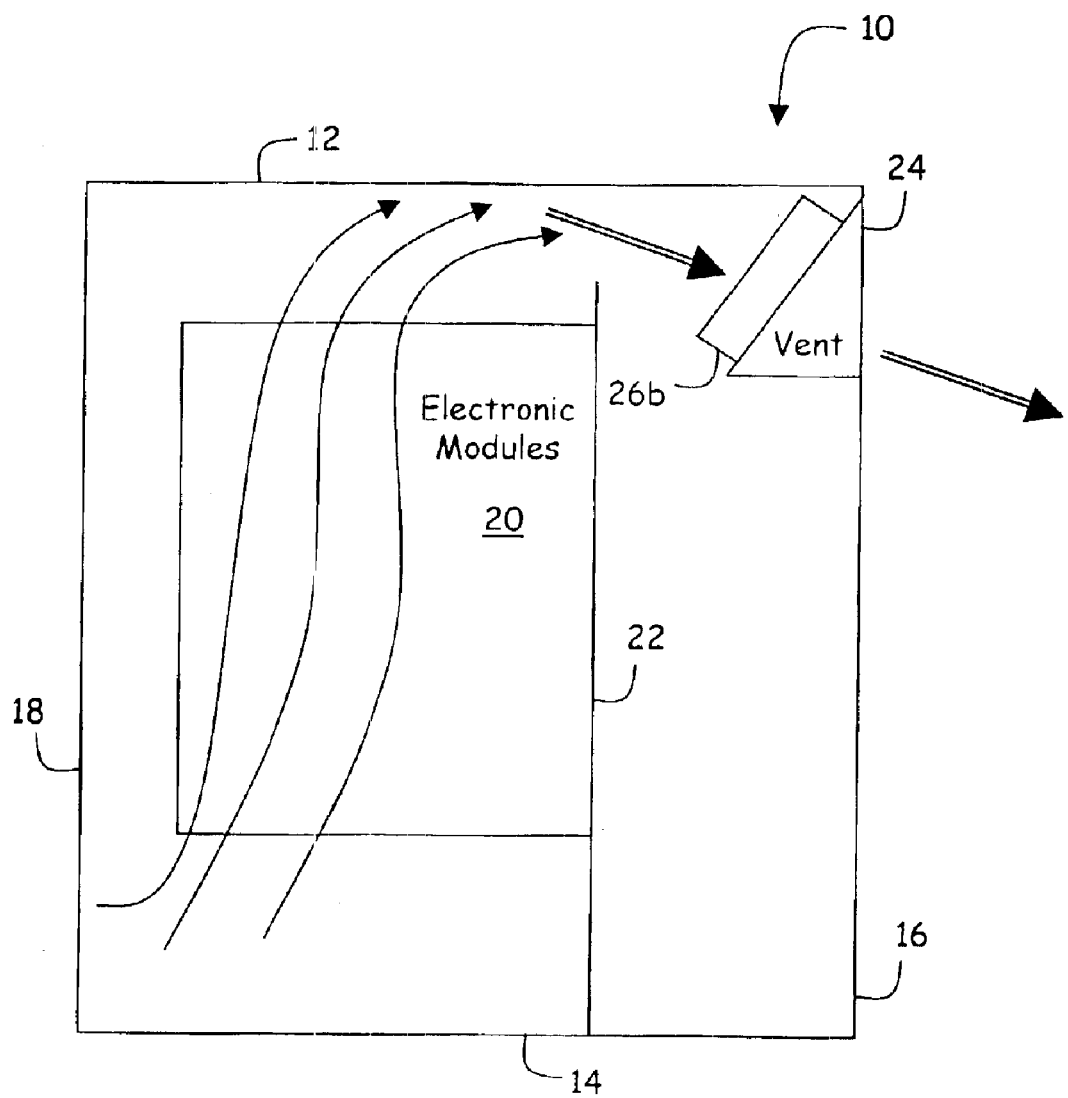

FIGS. 3 and 4 are detailed side view diagrams of the relationship of the environmental flow mechanism 26, the vent 24, and the environmental opening particular embodiments according to the invention. In the embodiments depicted in the FIGS. 3 and 4, the flow of air from within the enclosure 10 is specifically oriented to be taken from an upper portion of the enclosure 10.

In FIG. 3, the environmental flow mechanism 26a and the vent 24a are disposed on the back wall 16 of the enclosure near the upper portion of the back wall 16. In particular, the orientation of the vent 24a and the environmental flow mechanism 26a pulls the flow of air from across the top of the enclosure 10. Accordingly, the orientation of the environmental flow mechanism 26a creates a flow directed from across the top of forward portion of the enclosure 10. This flow directed across the top of the enclosure 10, along with the interaction of the inner wall 22, creates an upward and lateral airflow as depicted by the arrows in FIG. 3.

FIG. 4 is a depiction of an alternative embodiment of the directed airflow created by the interaction of the inner wall 22 and the position and orientation of the environmental flow mechanism 24b and the vent 26b. In FIG. 4, the environmental flow mechanism 26b and vent 24b are again oriented to create a flow of air originating from near the top of the enclosure 10. However, in distinction to the apparatus depicted in FIG. 3, the environmental flow mechanism 26b and the vent 24b are disposed to create a flow that is away from the parallel relative to the top wall 12.

However, like the apparatus of FIG. 3, the flow of air is directed from the upper portions of the enclosure 10. However, in this case, the environmental flow mechanism 26b is oriented to create a flow at an angle away from the parallel relative to the upper wall 12. In this case, the vertical flow of air across and electronic module 20 is enhanced due to the vertical orientation of the airflow. The angled flow creates a more distributed vertical airflow across the electronic module 20 as opposed to the more parallel output airflow of FIG. 3.

It should be noted that the orientation of the mechanisms may be reversed. Thus, the present embodiments depicted in FIGS. 1, 2A, 2B, 3, and 4 depict the enclosure 10 having a directed flow from the upper portions of the enclosure 10. It is possible to create a similar structure whereby a flow is created along the lower portions of the enclosure 10. Accordingly, the orientation of vertical flow across the electronic module may be either upwards or downwards according to the specific embodiment.

Figure 5:
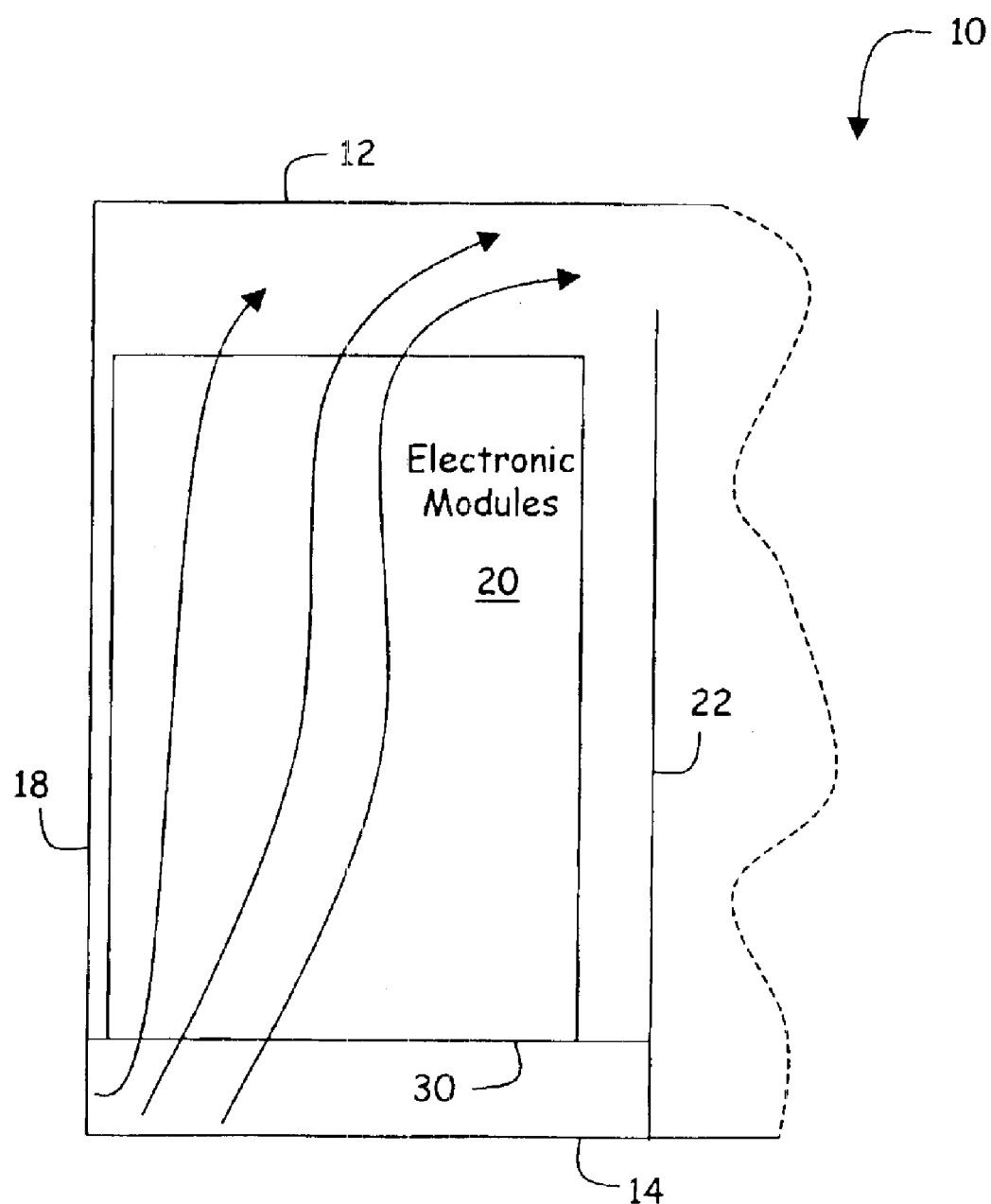
FIG. 5 is a cutaway diagram of an alternative embodiment of the enclosure having an inner floor, in accordance with one aspect of the invention.

FIG. 5 is a cutaway diagram of an alternative embodiment of the enclosure having an inner floor, according to one aspect of the invention. This embodiment contains an optional inner floor 30. This inner floor 30 is disposed between the front wall 18 and the inner wall 22. The inner floor 30 is disposed at a height below the environmental opening. In this embodiment, the inner floor 30 allows for additional support for the electronic modules 20. The inner floor 30 contains holes disposed in it, allowing for any flow of air on the inflow openings disposed on the sides or front of the enclosure 10 near the bottom to flow upwards through the inner floor 30.

Figure 6:
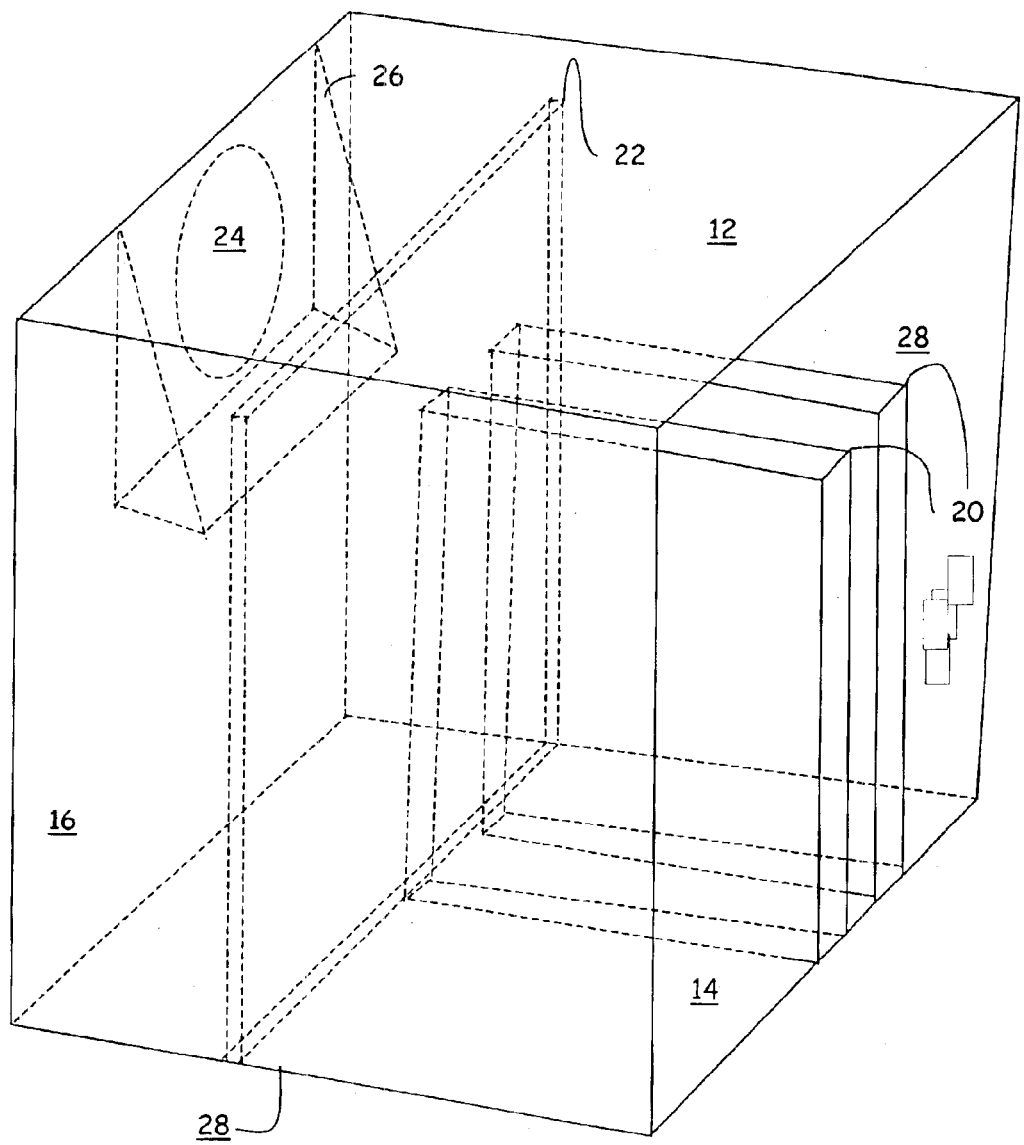
FIG. 6 is a perspective view of an enclosure according to an aspect of the invention.

FIG. 6 is a perspective view of an enclosure according to an aspect of the invention. It should be noted that the inner floor is not depicted, but may be added. Further, the vent may be placed at any place on an exterior wall, and may be oriented at an angle differing than that depicted.

Figure 7:
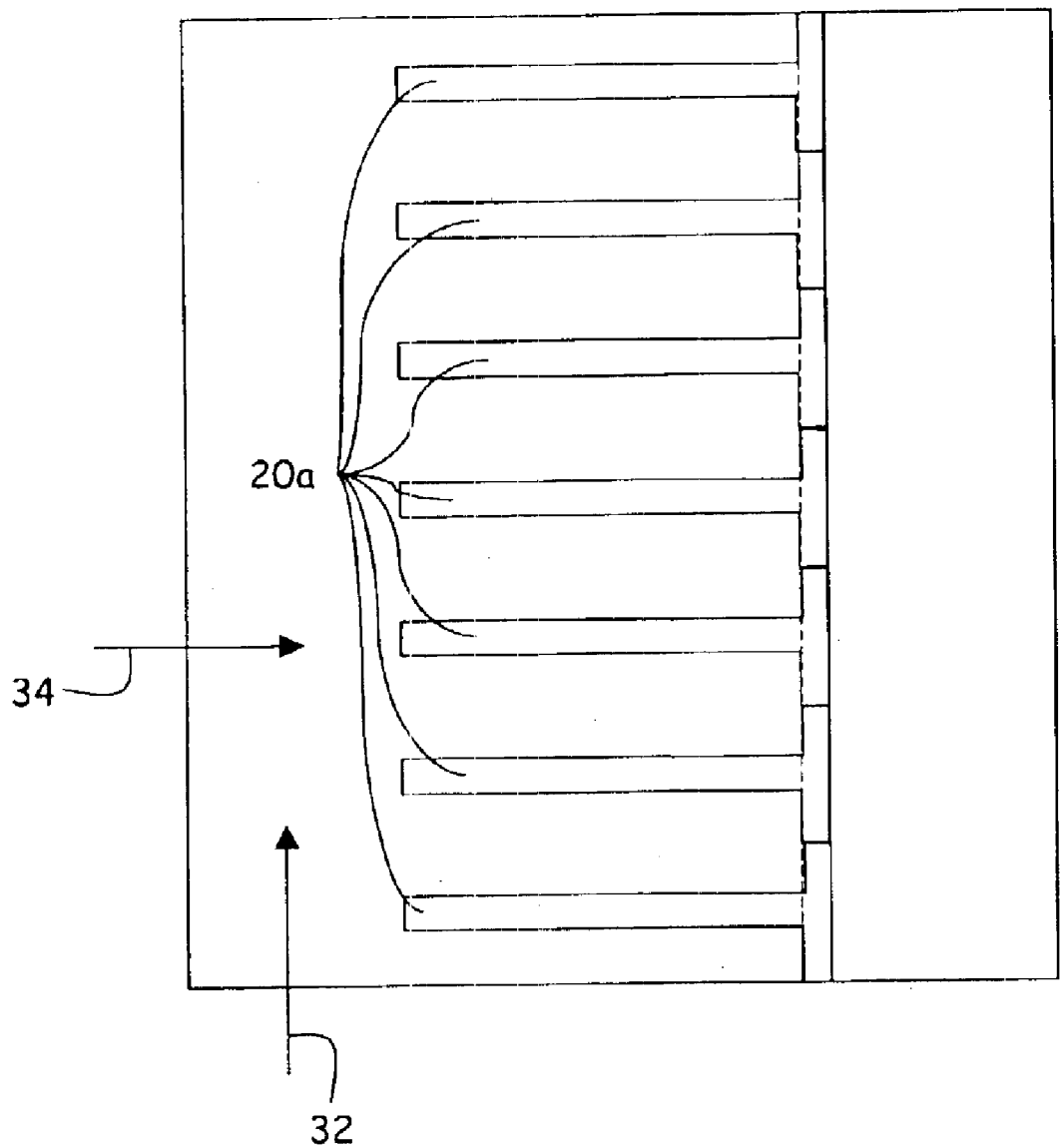
FIG. 7 is a cutaway diagram from the top detailing the horizontal airflows into the enclosure in accordance with the invention.

FIG. 7 is a cutaway diagram from the top of the enclosure detailing horizontal airflows within it in accordance with the invention. A plurality of components 20a is disposed in the enclosure of FIG. 7. The horizontal airflows 34 and 32 may be introduced into the enclosure of FIG. 7 through openings. It should be noted that the horizontal airflows may have both a horizontal component in the front to back direction or that in a side to side direction. Further, an airflow may have both a vertical component and a horizontal component. The structure 22a blocks horizontal components and redirects those components to a vertical. Thus, the horizontal components are changed into a vertical direction, that is, the horizontal component of the airflow is decreased and the vertical component remains proportionately unaffected. Note that the structure 22a can be made from the substructures of the components 20a, and this type of structure may be used in any embodiment.

Thus, an enclosure for the storage and operation of electronic components having increased airflow characteristics is described and illustrated. Those skilled in the art will recognize that many modifications and variations of the present invention are possible without departing from the invention. Of course, the various features depicted in each of the figures and the accompanying text may be combined together. Accordingly, it should be clearly understood that the present invention is not intended to be limited by the particular features specifically described and illustrated in the drawings, but the concept of the present invention is to be measured by the scope of the appended claims. It should be understood that various changes, substitutions, and alterations could be made hereto without departing from the spirit and scope of the invention as described by the appended claims that follow.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An enclosure for retaining and operating a plurality of electronic modules, the enclosure comprising:

a housing having front, side, upper, lower, and rear walls, said housing enclosing an inner volume;

an inner wall running between said side walls and attached to said lower wall, said inner wall positioned between said front and back walls, said inner wall splitting said inner volume into a first inner volume and a second inner volume;

said inner wall extending from the bottom wall to a height less than that of the height of said top wall, said inner wall at least in part defining an environmental opening between the first inner volume and the second inner volume, said inner wall blocking a lateral airflow across the inner volume;

a vent disposed through the rear wall;

openings disposed in the housing, said openings disposed into the first inner volume, operable to allow an airflow into the first inner volume; and an environmental flow mechanism, coupled in proximity to said vent, the environmental flow mechanism oriented to create an outgoing airflow from an upper portion of said housing through said vent;

whereby the interaction of the airflow from the upper portion of said housing and blocking of the lateral airflow by said inner wall produces a flow of air from said openings near the bottom of said housing, upwards to said environmental opening.

2. The enclosure of claim 1 further comprising:
an inner bottom floor with vents, said inner bottom floor attached to said front wall, said inner wall, and said side walls;
wherein said inner bottom floor has vents disposed in it.

3. The enclosure of claim 2 wherein said openings on said housing are disposed at a height below said inner bottom floor.

4. The enclosure of claim 1 wherein said outgoing airflow is directed laterally from the upper portion of said housing.

5. The enclosure of claim 4 wherein said environmental flow mechanism is oriented at an angle away from parallel to said rear wall.

6. The enclosure of claim 1 wherein said vent is oriented at an angle away from parallel to said rear wall.

7. The enclosure of claim 6 wherein said environmental flow mechanism is oriented at an angle oriented downwards.

8. The enclosure of claim 1 wherein said environmental flow mechanism is a fan.

9. The enclosure of claim 1 wherein said openings are disposed in said front wall.

10. The enclosure of claim 1 wherein said openings are disposed in at least one of said side walls.

11. The enclosure of claim 1 wherein said openings are disposed into a frontal portion of the inner volume.

12. The enclosure of claim 1 wherein said openings are disposed into a lower portion of the inner volume.

13. An enclosure for retaining and operating a plurality of electronic modules, the enclosure comprising:
a housing having front, side, upper, lower, and rear walls, said housing enclosing an inner volume;
an inner structure running between said side walls and attached to said lower wall, said inner structure positioned between said front and back walls;
said inner structure extending from the bottom wall to a height less than that of the height of said top wall, said inner structure defining at least one side of an environmental opening within said housing, said inner structure impinging a horizontal flow of air through said housing and redirecting the horizontal flow of air into a vertical flow of air within said housing;
a vent disposed through the rear wall;
openings in said housing, operable to allow an incoming airflow into said housing; and
an environmental flow mechanism, coupled in proximity to said vent, said environmental flow mechanism oriented to create an outgoing airflow directed from an upper portion of said housing outwards from said housing;
whereby interaction of the environmental flow mechanism, the outgoing airflow from the upper portion of said housing, and the redirecting the horizontal flow of air by said inner structure produces a flow of air from said openings in said housing, towards said environmental opening, and out of said housing.

14. The enclosure of claim 13 further comprising:
an inner bottom floor with vents disposed within said housing;
wherein said inner bottom floor has vents disposed in it.

15. The enclosure of claim 14 wherein said openings on said housing are disposed at height below said inner bottom floor.

16. The enclosure of claim 13 wherein said outgoing airflow is directed laterally from the upper portion of said enclosure.

17. The enclosure of claim 16 wherein said environmental flow mechanism is oriented at an angle away from parallel relative to said rear wall.

18. The enclosure of claim 13 wherein said vent is oriented at an angle away from parallel to said rear wall.

19. The enclosure of claim 13 wherein said environmental flow mechanism is oriented downwards.

20. The enclosure of claim 13 wherein said environmental flow mechanism is oriented upwards.

21. The enclosure of claim 13 wherein said environmental flow mechanism is a fan.

22. The enclosure of claim 13 wherein said openings are disposed in said front wall.

23. The enclosure of claim 13 wherein said openings are disposed in at least one of said side walls.

24. The enclosure of claim 13 wherein said openings are disposed into a frontal portion said housing.

25. The enclosure of claim 13 wherein said openings are disposed into a lower portion of said housing.

26. A method of creating an airflow through an enclosure for retaining and operating a plurality of electronic modules, the enclosure comprising a housing having front, side, upper, lower, and rear walls, and an inner structure running between said side walls and attached to said lower wall, said inner structure defining an environmental opening within said housing, the method comprising:
initiating, by an environmental flow mechanism, an outflow from an upper portion of said housing through a vent disposed in said rear wall of said housing;
creating an airflow through said environmental opening;
redirecting a lateral flow of air through said housing into a vertical flow of air with said inner structure, and redirecting a horizontal flow of air into a vertical flow of air within said housing;
creating an inflow of air through openings in said housing.

27. The method of claim 26 further, said housing further comprising:
an inner bottom floor with vents disposed within said housing;
said inflow entering at directed at least in part through said vents in said inner bottom floor.

28. The method of claim 26, wherein said openings on said housing are disposed at height below said inner bottom floor.

29. The method of claim 26, said step of creating an airflow further comprising:
creating a lateral airflow from the upper portion of said enclosure.

30. The method of claim 26, said step of creating an airflow further comprising:
creating an airflow at an angle away from the parallel to said top wall.

31. The method of claim 30 wherein said angle is oriented downwards.

32. The method of claim 26 wherein said environmental flow mechanism is a fan.

33. An enclosure for retaining and operating a plurality of electronic modules, the enclosure comprising:
a housing having front, side, upper, lower, and rear walls, said housing enclosing an inner volume;
means for inhibiting a horizontal flow of air from front to back within the inner volume, means for said means for inhibiting disposed between said side walls and attached to said lower wall, said means for inhibiting disposed between said front and back walls, said means for inhibiting splitting said inner volume into a first inner volume and a second inner volume;

said means for inhibiting extending from the bottom wall to a height less than that of the height of said top wall, said means for inhibiting at least in part defining an environmental opening between the first inner volume and the second inner volume;

an exhaust vent disposed through the rear wall;

means for allowing an intake airflow disposed in the housing, said means for allowing an intake airflow disposed into the first inner volume, operable to allow an airflow into the first inner chamber; and means for creating an airflow, coupled in proximity to said exhaust vent, the means for creating an airflow oriented to create an outgoing airflow from the upper portion of said housing through said exhaust vent;

whereby the interaction of the airflow from the upper portion of said housing and blocking of the horizontal airflow by said means for inhibiting produces a flow of air from said openings near the bottom of said housing, upwards to said environmental flow opening.

34. An enclosure for retaining and operating a plurality of electronic modules comprising:

a housing having front, side, upper, lower, and rear walls;

means for creating an airflow from an upper portion of said housing through a vent disposed in said housing;

means for redirecting a lateral flow of air through said housing into a vertical flow of air, and redirecting a lateral flow of air into a vertical flow of air within said housing;

means for allowing an inflow into said housing;

said housing further comprising:

an inner bottom floor with vents disposed within said housing;

said inflow entering at least in part through said vents in said inner bottom floor.

35. An enclosure for retaining and operating a plurality of electronic modules comprising:

a housing having front, side, upper, lower, and rear walls;

means for creating an airflow from an upper portion of said housing through a vent disposed in said housing;

means for redirecting a lateral flow of air through said housing into a vertical flow of air, and redirecting a lateral flow of air into a vertical flow of air within said housing;

means for allowing an inflow into said housing, wherein said means for allowing are disposed on said housing at a height below said inner bottom floor.

36. An enclosure for retaining and operating a plurality of electronic modules, the enclosure comprising:

a housing having front, side, upper, lower, and rear walls, said housing enclosing an inner volume;

a structure dividing said inner volume into a first inner volume and a second inner volume;

said structure impinging a flow of air from said first inner volume to said second inner volume, said structure having an environmental opening between the first inner volume and the second inner volume, said structure redirecting an airflow in a horizontal direction within said first inner volume into an airflow in a vertical direction;

a vent disposed through said rear wall;

openings disposed in the housing, said openings disposed into the first inner volume, operable to allow an airflow into the first inner volume; and an environmental flow mechanism, coupled in proximity to said vent, said environmental flow mechanism oriented to create an outgoing airflow from an upper portion of said housing through said vent;

whereby an interaction of the redirecting of the airflow by said structure and the airflow from the upper portion of said housing, produces a flow of air from said openings disposed in said housing, towards said environmental opening, and out of said housing.

37. The enclosure of claim 36 further comprising:

an inner bottom floor with vents disposed within said housing;

wherein said inner bottom floor has vents disposed in it.

38. The enclosure of claim 36 wherein said openings on said housing are disposed at a height below said inner bottom floor.

39. The enclosure of claim 36 wherein said outgoing airflow is directed laterally from the upper portion of said enclosure.

40. The enclosure of claim 36 wherein said environmental flow mechanism is oriented at an angle away from parallel relative to said rear wall.

41. The enclosure of claim 36 wherein said vent is oriented at an angle away from parallel to said rear wall.

42. The enclosure of claim 36 wherein said environmental flow mechanism is oriented downwards.

43. The enclosure of claim 36 wherein said environmental flow mechanism is oriented upwards.

44. The enclosure of claim 36 wherein said environmental flow mechanism is a fan.

45. The enclosure of claim 36 wherein said openings are disposed in said front wall.

46. The enclosure of claim 36 wherein said openings are disposed in at least one of said side walls.

47. The enclosure of claim 36 wherein said openings are disposed into a frontal portion said housing.

48. The enclosure of claim 36 wherein said openings are disposed into a lower portion of said housing.

49. The enclosure of claim 36 wherein said inner wall is attached to said top wall.

50. An electronic communications device comprising:

a housing having front, side, upper, lower, and rear walls, said housing enclosing an inner volume;

a plurality of electronic modules, said plurality of electronic modules retained and operable within said housing;

a structure dividing said inner volume into a first inner volume and a second inner volume;

said structure impinging a flow of air from said first inner volume to said second inner volume, said structure having an environmental opening between the first inner volume and the second inner volume, said structure redirecting an airflow in a horizontal direction within said first inner volume into an airflow in a vertical direction;

a vent disposed through said rear wall;

openings disposed in the housing, said openings disposed into the first inner volume, operable to allow an airflow into the first inner volume; and an environmental flow mechanism, coupled in proximity to said vent, said environmental flow mechanism oriented to create an outgoing airflow from the upper portion of said housing through said vent;

whereby an interaction of the redirecting of the airflow by said structure and the airflow from the upper portion of said housing, produces a flow of air from said openings disposed in said housing, towards said environmental opening, and out of said housing.

* * * * *

UNITED STATES PATENT AND TRADEMARK OFFICE
CERTIFICATE OF CORRECTION

PATENT NO. : 6,951,513 B1 Page 1 of 1
APPLICATION NO. : 10/429200
DATED : October 4, 2005
INVENTOR(S) : Greenslade et al.

It is certified that error appears in the above-identified patent and that said Letters Patent is hereby corrected as shown below:

Column 3 line 58, replace "26'" with --24--.

Column 5 line 22, replace "24b" with --26b--.

Column 5 line 22, replace "26b" with --24b--.

Column 6 line 62, replace ";" --,--.

Column 7 line 50, replace ";" with --,--.

Column 9 line 16, replace ";" with --,--.

Column 10 line 2, replace ";" with --,--.

Column 10 line 61, replace ";" with --,--.

Signed and Sealed this

Seventh Day of November, 2006

JON W. DUDAS
*Director of the United States Patent and Trademark Office*